(12) United States Patent
Toko

(10) Patent No.: US 10,600,978 B2
(45) Date of Patent: Mar. 24, 2020

(54) LIQUID CRYSTAL ELEMENT AND LIGHT CONTROL APPARATUS FOR ACCURATE LIGHT CONTROL

(71) Applicant: STANLEY ELECTRIC CO., LTD., Meguro-ku, Tokyo (JP)

(72) Inventor: Yasuo Toko, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/668,262

(22) Filed: Aug. 3, 2017

(65) Prior Publication Data
US 2018/0062097 A1   Mar. 1, 2018

(30) Foreign Application Priority Data

Aug. 25, 2016 (JP) .................. 2016-165164

(51) Int. Cl.
| | |
|---|---|
| H01L 51/44 | (2006.01) |
| G02F 1/1343 | (2006.01) |
| G02F 1/1333 | (2006.01) |
| G02F 1/03 | (2006.01) |
| H01L 51/00 | (2006.01) |
| G02F 1/1337 | (2006.01) |

(52) U.S. Cl.
CPC .......... *H01L 51/442* (2013.01); *G02F 1/0316* (2013.01); *G02F 1/0322* (2013.01); *G02F 1/133305* (2013.01); *G02F 1/133345* (2013.01); *G02F 1/134309* (2013.01); *H01L 51/0012* (2013.01); *H01L 51/0023* (2013.01); *G02F 1/1337* (2013.01); *G02F 2001/133354* (2013.01); *G02F 2001/134381* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,102,718 B1* | 9/2006 | Yamazaki | ......... | G02F 1/134363 257/E27.111 |
| 2012/0062814 A1* | 3/2012 | Yamazaki | ............. | G02F 1/1333 349/43 |
| 2014/0111754 A1* | 4/2014 | Matsumoto | ....... | G02F 1/133723 349/123 |

FOREIGN PATENT DOCUMENTS

JP   2010217351 A   9/2010

* cited by examiner

*Primary Examiner* — Lauren Nguyen
(74) *Attorney, Agent, or Firm* — Holtz, Holtz & Volek PC

(57) ABSTRACT

To improve the accuracy of fully controlling the direction of advancing light. The liquid crystal element includes a first substrate and a second substrate, a liquid crystal layer provided between one surface side of the first substrate and one surface side of the second substrate, a pair of electrodes provided on one surface side of the first substrate with a gap therebetween in a planer view, a high-resistance film provided on one surface side of the first substrate and disposed between the pair of electrodes in a planer view and connected thereto, a first alignment film provided on one surface side of the first substrate covering the pair of electrodes and the high-resistance film, a second alignment film provided on one surface side of the second substrate, wherein sheet resistance of the high-resistance film is greater than sheet resistance of the pair of electrodes.

14 Claims, 14 Drawing Sheets alignment direction

100

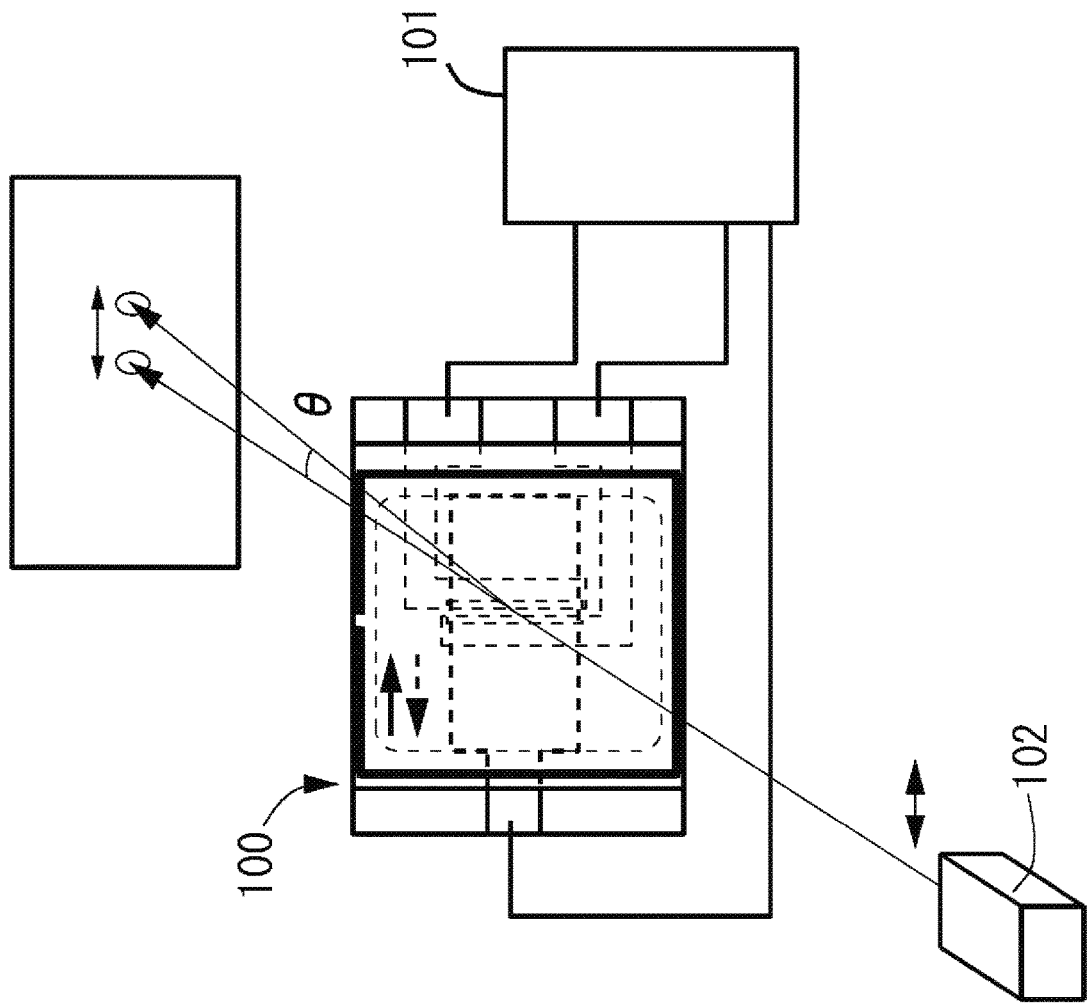

Fig. 7

| cell thickness | alignment condition | alignment state | driving condition | result |
|---|---|---|---|---|
| 10 μm | anti-parallel | vertical alignment | 15V, 100Hz | light bending angle:10.8°<br>response speed:300ms |
| 10 μm | anti-parallel | vertical alignment | 15V, 8kHz | light bending angle:14.4°<br>response speed:300ms |
| 100 μm | anti-parallel | vertical alignment | 20V, 100Hz | light bending angle:19.4°<br>response speed:5s |
| 100 μm | anti-parallel | vertical alignment | 20V, 8kHz | light bending angle:25.8°<br>response speed:5s |

Fig. 9

| cell thickness | alignment condition | alignment state | driving condition | result |
|---|---|---|---|---|
| 10 μm | parallel | horizonal alignment | 30V, 100Hz | light bending angle:5.6°<br>response speed:200ms |
| 100 μm | parallel | horizonal alignment | 50V, 100Hz | light bending angle:10.0°<br>response speed:3s |
| 100 μm | anti-parallel | horizonal alignment | 50V, 100Hz | light bending angle:14.6°<br>response speed:5s |

LIQUID CRYSTAL ELEMENT AND LIGHT CONTROL APPARATUS FOR ACCURATE LIGHT CONTROL

BACKGROUND OF THE INVENTION

Field of the Invention

The present invention relates to a technique for fully controlling the direction of advancing light.

Description of the Background Art

Japanese Unexamined Patent Application Publication No. 2010-217351 discloses an optical scanner which controls the optical path of the luminous flux using liquid crystal elements. The liquid crystal elements of this optical scanner each have two input terminals and a liquid crystal layer which changes in refractive index in accordance with the voltages applied to the input terminals. While light flux is made incident to the liquid crystal elements, by applying different effective voltages to the two input terminals, the optical path of luminous flux can be bent.

The above-described liquid crystal elements are provided with two input terminals on one side of the substrate, and are structured so that a plurality of stripe electrodes are arranged between these input terminals. Respective one ends of a plurality of stripe electrodes are mutually connected via thin wire electrode. And one of the two input terminals is connected to one end of the thin wire electrode and the other is connected to the other end thereof.

In the liquid crystal elements described above, the area where a plurality of stripe electrodes are arranged is considered to be the effective area capable of modulating incident light. Therefore, when voltage is applied to the input terminals, the alignment state of the liquid crystal molecules in the liquid crystal layer changes in areas between the adjacent stripe electrodes, but the alignment state does not change on the upper side of each of the stripe electrodes. That is, the area where the alignment changes and does not change is alternately repeated, and the phase difference distribution within the liquid crystal layer becomes step-wise, and therefore is considered unsuitable for a precise light control.

Further, in the area where alignment change does not occur even when voltage is applied, since the alignment state does not change irrespective of voltage application, there is a possibility of light control accuracy reduction.

SUMMARY OF THE INVENTION

It is therefore an object of one aspect according to the present invention to provide a technique capable of improving the accuracy of fully controlling the direction of advancing light.

The liquid crystal element according to a specific mode of the present invention includes (a) a first substrate and a second substrate disposed opposite each other, (b) a liquid crystal layer provided between one surface side of the first substrate and one surface side of the second substrate, (c) a pair of electrodes provided on one surface side of the first substrate with a gap therebetween in a planer view, (d) a high-resistance film provided on one surface side of the first substrate and disposed between the pair of electrodes in a planer view and connected thereto, (e) a first alignment film provided on one surface side of the first substrate, covering the pair of electrodes and the high-resistance film, (f) a second alignment film provided on one surface side of the second substrate, (g) wherein sheet resistance of the high-resistance film is greater than sheet resistance of the pair of electrodes.

The light control apparatus according to a specific mode of the present invention includes a first liquid crystal element and a second liquid crystal element disposed to overlap each other, a drive unit for driving the first liquid crystal element and the second liquid crystal element, wherein the above-described liquid crystal element is respectively used for the first liquid crystal element and the second liquid crystal element.

According to the foregoing configuration, since the alignment state of the liquid crystal molecules in the liquid crystal layer can be continuously changed between the pair of electrodes, by irradiating an incident light into this area, when fully controlling the direction of advancing light which passes through the liquid crystal layer, it is possible to improve the accuracy.

BRIEF DESCRIPTION OF THE DRAWINGS

FIG. 6 is a schematic diagram showing the configuration of a light control apparatus using the liquid crystal element.

FIG. 7 shows the measurement results of the light bending angle θ and the response speed, based on several conditions.

FIG. 9 shows the measurement results of the light bending angle θ and the response speed, based on several conditions.

DESCRIPTION OF THE PREFERRED EMBODIMENTS

Embodiment 1

Figure 1A:
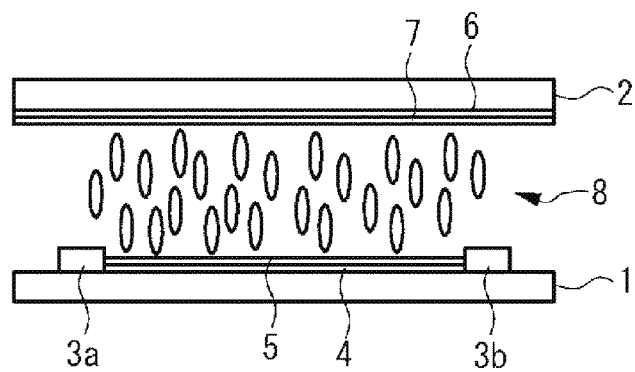
FIGS. 1A-1C are schematic cross sectional views to describe the basic structure and the operation principle of the liquid crystal element.
Figure 1B:
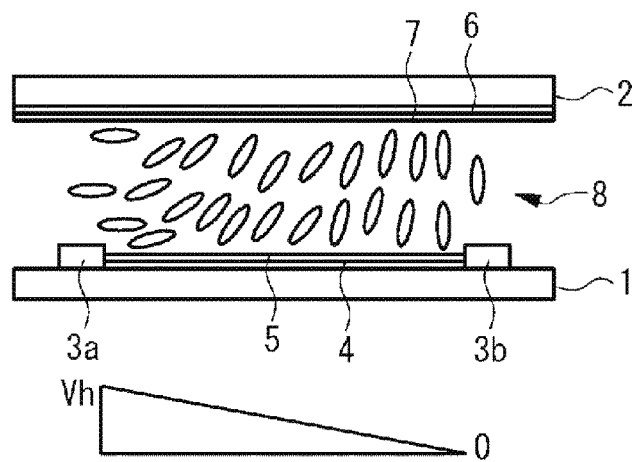
Figure 1C:
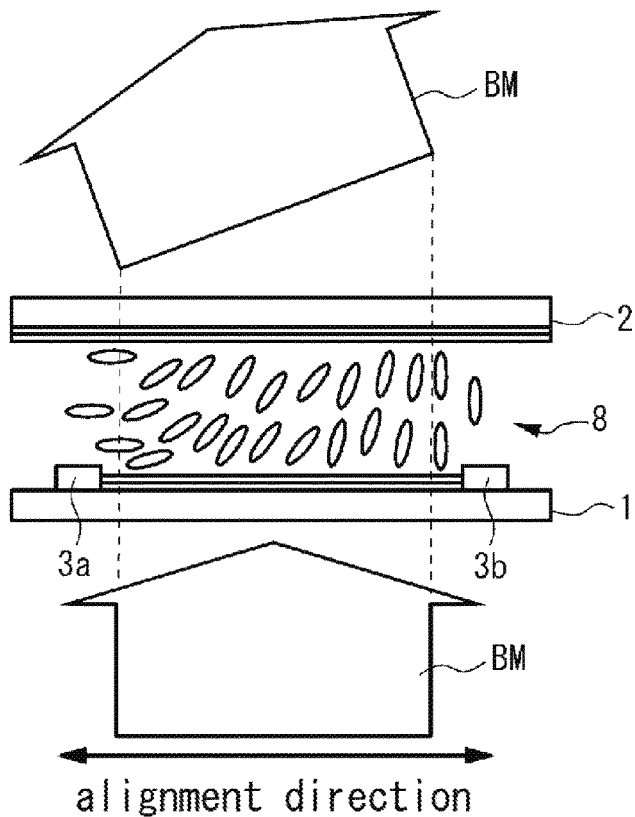

FIGS. 1A-1C are schematic cross sectional views to describe the basic structure and the operation principle of the liquid crystal element. In the liquid crystal element shown in FIG. 1A, a liquid crystal layer 8 is provided between two substrates 1, 2 (transparent substrates) disposed opposite each other. And on one surface side of the substrate 1 is disposed a pair of electrodes 3a, 3b, a high-resistance film 4 provided between these electrodes 3a, 3b and connected thereto, and an alignment film 5 provided at least on the upper area of the high-resistance film 4. On one surface side of the substrate 2 is disposed a common electrode 6 provided to the area at least opposing each of the electrodes 3a, 3b and the high-resistance film 4, and an alignment film 7 provided on at least the upper area of the common electrode 6.

In the example shown in the figure, each of the alignment films 5, 7 is performed an alignment process such as a rubbing treatment and is a vertical alignment film whose alignment regulation force extends in one direction. Further, the liquid crystal layer 8 is formed by using liquid crystal material in which the dielectric anisotropy is negative. And the liquid crystal molecules in the liquid crystal layer 8 are affected by alignment regulation forces of the alignment films 5, 7 and are aligned in one direction (the horizontal direction in the figure for example). The liquid crystal molecules are substantially vertically aligned when voltage is not applied (initial alignment). The term "substantially vertically aligned" used here is defined as the pretilt angle to be close to yet smaller than 90° (for example, 88°-89.9°.

Note that, in principle, on each of the alignment films 5, 7, alignment process such as a rubbing treatment may be performed to achieve horizontal alignment films with alignment regulation force in one direction. In this case, the liquid crystal layer 8 is formed by using liquid crystal material in which the dielectric anisotropy is positive. And the liquid crystal molecules in the liquid crystal layer 8 are affected by alignment regulation force of the alignment films 5, 7 and are aligned in one direction (the horizontal direction in the figure for example). The liquid crystal molecules are substantially horizontally aligned when voltage is not applied (initial alignment). The term "substantially horizontally aligned" used here is defined as the pretilt angle to be close to yet greater than 0° (for example, 2°-5°).

As shown in FIG. 1B, for example, voltage is applied to generate a potential difference Vh between the electrode 3a and the electrode 3b. As an example, voltage of 15V is applied to the electrode 3a, and 0V is applied to the electrode 3b and the common electrode 6. An alternating voltage of 100 Hz frequency is applied, for example. This voltage application generates a continuous voltage gradient between the electrode 3a and the electrode 3b since the electrodes 3a, 3b are mutually conducted via the high-resistance film 4.

The alignment state of the liquid crystal molecules in the liquid crystal layer 8 changes according to this voltage gradient. Specifically, the closer the area is to the electrode 3a, the higher the voltage is in the area, and thus, the alignment state of the liquid crystal molecules changes greatly in this area according to this voltage. On the contrary, the closer the area is to the electrode 3b, the lower the voltage is in the area, and thus, the alignment state of the liquid crystal molecules changes slightly in this area according to this voltage. Further, in the area close to the electrode 3b, the alignment state of the liquid crystal molecules hardly changes. That is, between the electrode 3a and the electrode 3b where the high-resistance film 4 is present, the alignment state of the liquid crystal molecules in the liquid crystal layer 8 changes continuously according to the voltage gradient.

Polarized light such as laser beam, etc. is made incident to the liquid crystal element in the state described above. For example, as shown in FIG. 1C, a beam BM whose polarization direction is parallel to the alignment processing direction of each of the alignment films 5, 7 (the alignment direction of the molecules in the liquid crystal layer 8) is made incident to the other surface side of the substrate 1. Then, as shown in the figure, since the alignment state of the molecules in the liquid crystal layer 8 is continuously changing and thus the state of retardation is different depending on the location inside the liquid crystal layer 8, the passing speed of the beam BM differs depending on the location it passes through. Therefore, by applying Huygens' principle, it is considered that the advancing direction of the beam BM which passes through the liquid crystal layer 8 changes. In the example shown in the figure, the beam BM changes its direction towards the electrode 3a side whose voltage is relatively high. Here, contrary to the above, if the voltage gradient is formed so that the voltage of the electrode 3b side becomes relatively high, the beam BM changes its direction towards the electrode 3b.

Figure 2:
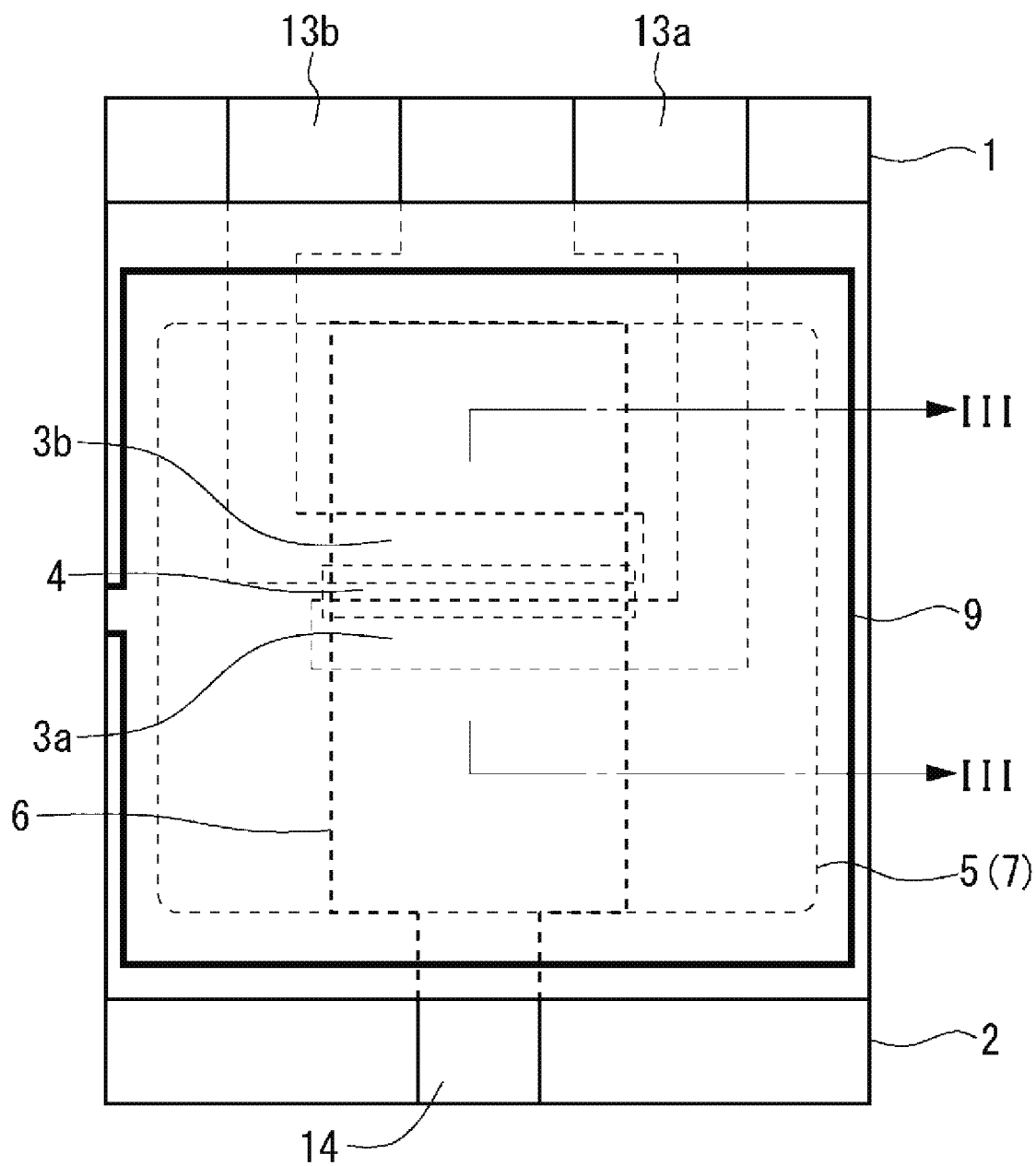
FIG. 2 is a schematic plan view showing the structure of the liquid crystal element according to embodiment 1.
Figure 3:
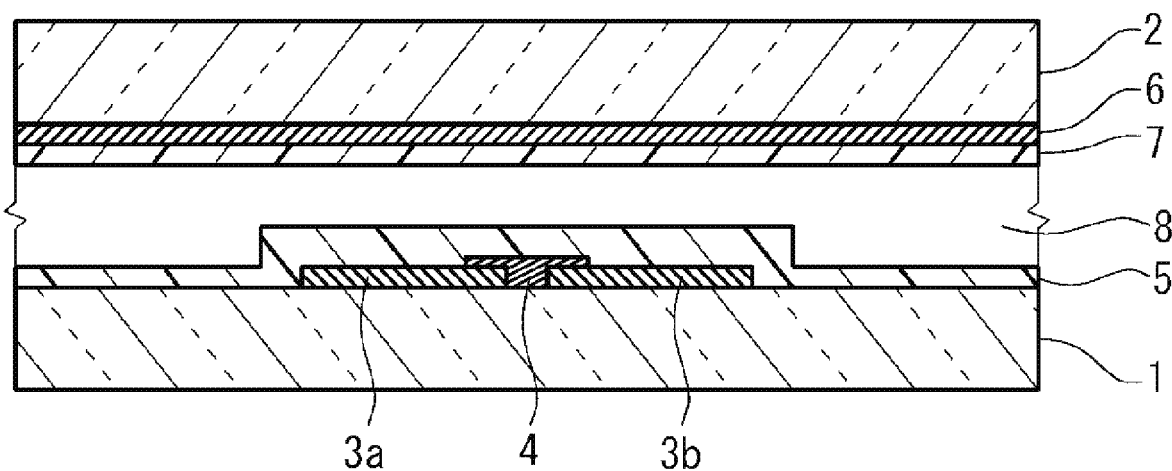
FIG. 3 is a schematic cross-sectional view showing the structure of the liquid crystal element according to embodiment 1.

FIG. 2 is a schematic plan view showing the structure of the liquid crystal element according to embodiment 1. And FIG. 3 is a schematic cross-sectional view showing the structure of the liquid crystal element according to this embodiment. Note that the cross section view shown in FIG. 3 corresponds to the cross section in the III-III direction shown in FIG. 2. In these figures, the same reference numerals are used for the components common to FIGS. 1A-1C. The liquid crystal element 100 of the embodiment shown in each figure is configured to include a first substrate 1, a second substrate 2, two electrodes 3a, 3b, a high-resistance film 4, a common electrode 6, alignment films 5, 7, a liquid crystal layer 8, and a seal member 9.

Both the first substrate 1 and the second substrate 2 are glass substrates, for example, having sufficient translucency. Here, the term "translucency" is defined as having transmittance high enough to allow transmission of the beam controlled by the liquid crystal element 100.

The two electrodes 3a, 3b are provided on one surface side of the first substrate 1. These electrodes 3a, 3b are formed, for example, by patterning a transparent conductive film made of indium tin oxide (ITO) or the like. In principle, since each of the electrodes 3a, 3b does not require translucency, they may be formed using metal thin films or the like with no translucency. Each of the electrodes 3a, 3b is formed in a rectangular shape extending in one direction with a gap therebetween in a planer view, for example. The electrode 3a is connected to an extraction electrode 13a via a wiring. The electrode 3b is connected to an extraction electrode 13b via a wiring. The extraction electrodes 13a, 13b are provided on one end side of the first substrate 1 (on the upper end side of the first substrate 1 in the example shown in the figure).

The high-resistance film 4 is disposed between the two electrodes 3a, 3b and connected thereto. In the example shown in the figure, the high-resistance film 4 is disposed to cover between the two electrodes 3a, 3b and cover a portion of each of the electrodes 3a, 3b. The high-resistance film 4 is formed using a material whose sheet resistance is higher than that of the material used for each of the electrodes 3a, 3b. For instance, it is preferable for the high-resistance film 4 to have a sheet resistance value which is 10 times or more than that of the material used for each of the electrodes 3a, 3b, and more preferable to have a sheet resistance value which is approximately from 100 times to the tenth power of 10.

The alignment film 5 is provided on one surface side of the first substrate 1 and covers each of the electrodes 3a, 3b and the high-resistance film 4. For this alignment film 5, either a vertical alignment film or a horizontal alignment film may be used selectively depending on how the initial alignment is determined on the liquid crystal layer 8.

The common electrode 6 is provided on one surface side of the second substrate 2. The common electrode 6 is formed, for example, by patterning a transparent conductive film made of ITO (indium tin oxide) or the like, for example. The common electrode 6 is provided to the area at least opposing each of the electrodes 3a, 3b. In the example shown in the figure, the common electrode 6 is formed rectangularly and is disposed extending in the vertical direction, partially opposing each of the electrodes 3a, 3b. The common electrode 6 is connected to an extraction electrode 14 via a wiring. The extraction electrode 14 is provided on one end side of the second substrate 2 (on the lower end side of the second substrate 2 in the example shown in the figure).

The alignment film 7 is provided on one surface side of the second substrate 2 and covers the common electrode 6. For this alignment film 7, either a vertical alignment film or a horizontal alignment film may be used selectively depending on how the initial alignment is determined on the liquid crystal layer 8.

The liquid crystal layer 8 is formed by using liquid crystal material in which the dielectric anisotropy is either negative or positive. And the initial alignment state (the alignment state when the voltage is not applied) of the liquid crystal layer 8 is determined by the alignment regulation forces from each of the alignment films 5, 7. For example, if vertical alignment films are used for each of the alignment films 5, 7, then the initial alignment state becomes a vertical one, and if horizontal alignment films are used for each of the alignment films 5, 7, then the initial alignment state becomes a horizontal one.

The seal member 9 is used to seal the liquid crystal layer 8. Between the first substrate 1 and the second substrate 2, the seal member 9 is formed in a frame shape surrounding the liquid crystal layer 8 in a plane view. The frame shaped seal member 9 has an opening in its portion, on its left side in the example shown in the figure, and this opening is used as an injection port and liquid crystal is injected therethrough.

FIGS. 4A-4F and FIGS. 5A-5B are schematic plan views describing the manufacturing process of the liquid crystal element of an embodiment.

Figure 4A:
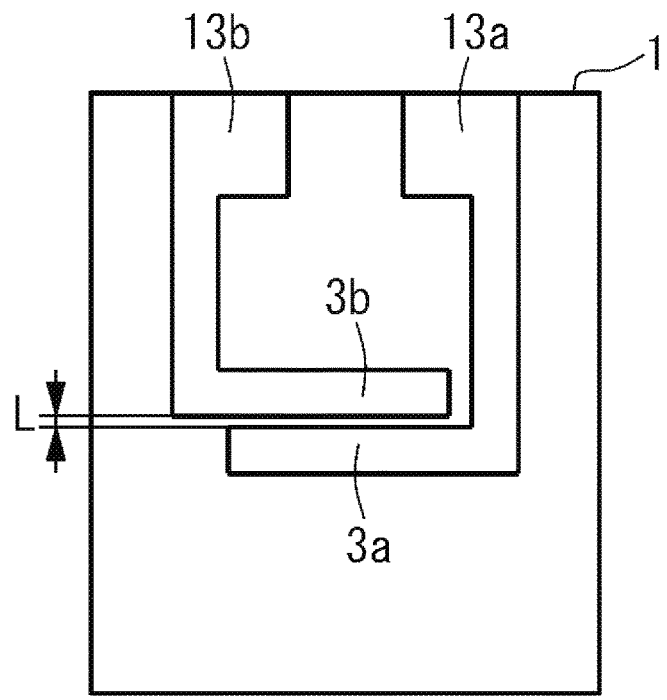
FIGS. 4A-4F are schematic plan views describing the manufacturing process of the liquid crystal element.

Referring to FIG. 4A, on one surface side of the first substrate 1 is formed each of the electrodes 3a, 3b, the wirings, and the extraction electrodes 13a, 13b. Each of the electrodes 3a, 3b, etc. are formed by preparing a glass substrate with ITO film formed on its entire one surface side and patterning the ITO film. Each of the electrodes 3a, 3b, etc. are formed so that the distance L therebetween is approximately 100 nm for example.

Figure 4B:
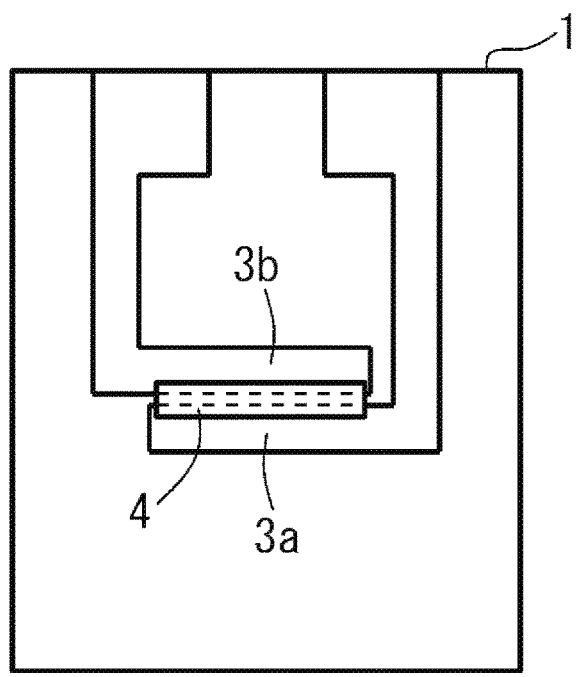

Next, referring to FIG. 4B, on one surface side of the first substrate 1 is formed the high-resistance film 4 between each of the electrodes 3a, 3b. In the example shown in the figure, the high-resistance film 4 is disposed to cover between each of the electrodes 3a, 3b and a portion of each of the electrodes 3a, 3b. At least, the high-resistance film 4 is required to cover the gap between each of the electrodes 3a, 3b. The high-resistance film 4 is formed using a material whose sheet resistance is higher than that of the material used for each of the electrodes 3a, 3b and a material being transparent in reference to the beam to be controlled.

As the high-resistance film 4 described above, for example, various metallic oxide films, a conductive polymer film (an organic conductive film), a thin film consisting of metal such as gold, a metal nanoparticle dispersed film or a metal oxide nanoparticle dispersed film, a nanoparticle dispersed film whose insulated nanoparticles are given electrical conductivity or the like may be cited. As the forming method of the high-resistance film 4, for example, vacuum film deposition methods such as sputtering or vacuum evaporation or the like, various printing methods such as flexographic printing, screen printing, inkjet printing, bar coating, slit coating, or the like, film forming method such as spin coating, dip-coating (including Langmuir-Blodgett method) or the like may be cited.

As described above, it is preferable for the high-resistance film 4 to have a sheet resistance value which is 10 times or more than that of the material used for each of the electrodes 3a, 3b, and more preferable to have a sheet resistance value which is approximately from 100 times to the tenth power of 10. As an example, if the sheet resistance of the ITO film used for each of the electrodes 3a, 3b is 10 Ω/sq, then the sheet resistance of the high-resistance film 4 may be about 1 k Ω/sq. It is preferable to set the sheet resistance higher in order to further reduce power consumption. Specifically, it is preferable to set the sheet resistance to approximately 1 k Ω/sq-10 Ω/sq, and for example, the resistance is to be set to about 100M Ω/sq. As an example, a ZnO film formed by sputtering may be used as the high-resistance film 4.

Here, regarding the film forming region of the high-resistance film 4, it is acceptable that the region covers the area at least where the controlled beam passes through, but it is preferable that the region does not cover the upper area of each of the extraction electrodes 13a, 13b which are respectively connected to electrodes 3a, 3b. Also, when an organic conductive film whose adhesiveness to the substrate is not high is used, it is preferable to avoid forming the high-resistance film 4 in the area where the seal member 9 is formed. Therefore, it is preferable to selectively form the high-resistance film 4 only at places where it is required using mask sputtering or various printing methods. Otherwise, if the film is formed onto the entire surface of the substrate using spin coating or the like, then it is preferable to perform patterning to remove the excessive portion by photolithography method or the like. Or it is acceptable to apply a resist film to each of the extraction electrodes 13a, 13b, form the high-resistance film 4 onto the films and then remove the resist films on the extraction electrodes 13a, 13b by lifting them off.

Further, an insulating film such as a passivation film and the like may be formed on the upper side of the high-resistance film 4. This is expected to prevent short circuit between the substrates and to improve optical function such as transmittance improvement, surface antireflection by matching the refractive index to the liquid crystal layer 8 and the like. When this insulating film is formed, also, it is preferable that it does not cover the upper side of each of the extraction electrodes 13a, 13b and the area where the seal member 9 is formed. Here, when silicon oxide film capable of flexographic printing is used for the insulating film, since adhesiveness to the substrate is high, the insulating film may be formed on the area where the seal member 9 is formed.

Figure 4C:
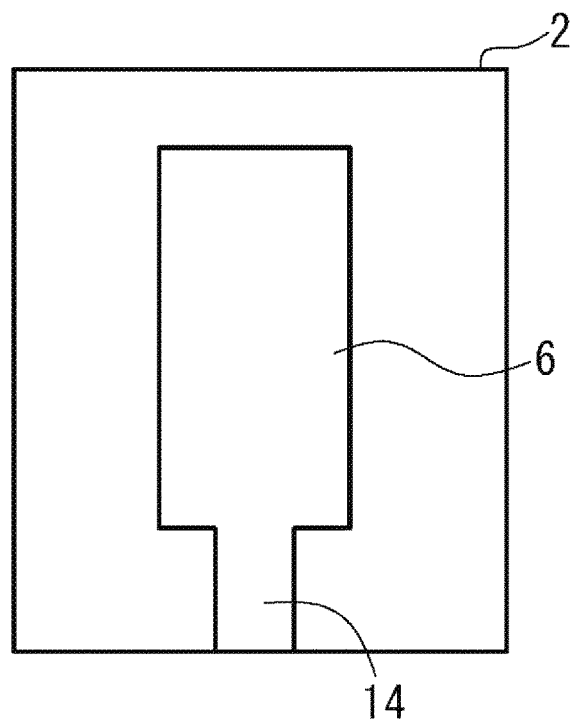

Next, referring to FIG. 4C, on one surface side of the second substrate 2 is formed the common electrode 6, the wiring and the extraction electrode 14. For example, the common electrode 6, etc. are formed by preparing a glass substrate with ITO film formed on its entire one surface side and patterning the ITO film.

Figure 4D:
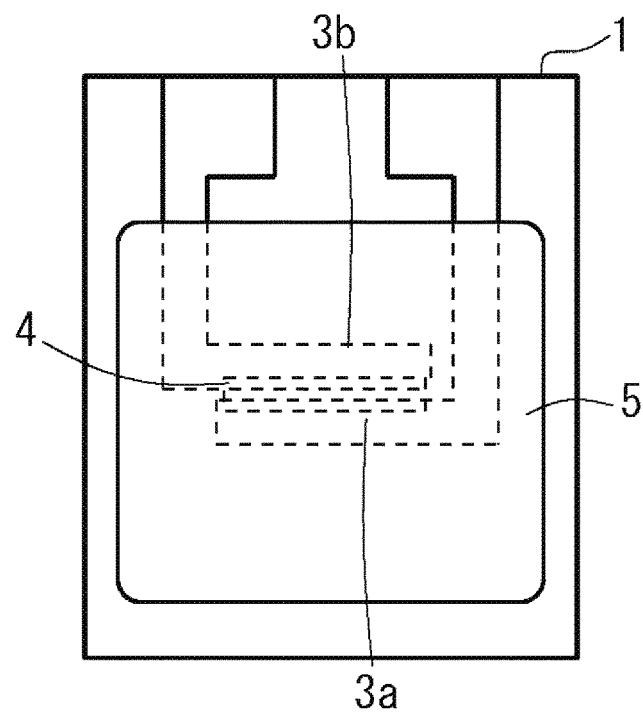
Figure 4E:
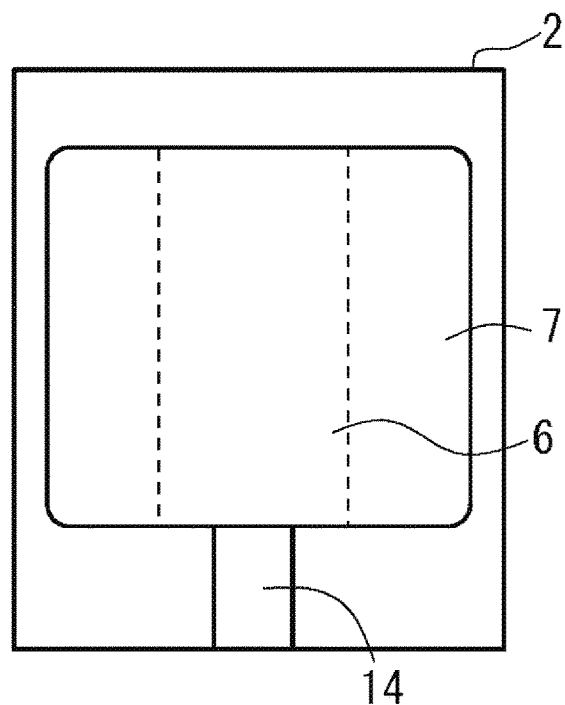

Next, referring to FIG. 4D, on one surface side of the first substrate 1 is formed the alignment film 5 to cover the region of at least where each of the electrodes 3a, 3b and the high-resistance film 4 are formed. Similarly, referring to FIG. 4E, on one surface side of the second substrate 2 is formed the alignment film 7 to the opposing region of at least where each of the electrodes 3a, 3b and the high-resistance film 4 are formed. Each of the alignment films 5, 7 is formed by coating alignment film material by flexographic printing, inkjet printing and the like and then heat-treated.

When vertical alignment films are formed as the alignment films 5,7, for example, vertical alignment film material whose side chain has a rigid skeleton (liquid crystalline material and the like) and with superior printability and adhesiveness is formed to an appropriate film thickness (500-800 Å, for example) by flexographic printing and then heat-treated (at 160-250 C.° and 1-1.5 hour of baking, for example). Here, the organic alignment films are not limited to the above-described type. Further, inorganic alignment films whose main chain consists of siloxane bonds (Si—O—Si bonds) or the like may be used, for example.

When horizontal films are formed as the alignment films 5,7, for example, horizontal alignment film material for STN whose pretilt angle is relatively high and with side chains (alkyl chains) is formed to an appropriate film thickness (500-800 Å, for example) by flexographic printing and then heat treatment (1-1.5 hour of baking at 160-250 C.°, for example). Here, the organic alignment films are not limited to the above-described type. Further, inorganic alignment films (SiO obliquely vapor-deposited film, for example) may be used, for example.

Next, alignment process is performed to the alignment films 5,7. As the alignment process, rubbing process whose process is to rub the alignment film in one direction is performed, for example. As for the condition, the indentation amount may be set to 0.3-0.8 mm, for example.

When each of the alignment films 5,7 is a vertical alignment film, the direction of the rubbing process is set to be substantially perpendicular to the extending direction of each of the electrodes 3a, 3b (left-right direction in the figure). Here, it is not required to be precisely perpendicular and the direction of the rubbing process may be set to be off by about 0.1-5°, for example.

Also, when each of the alignment films 5,7 is a horizontal alignment film, the direction of the rubbing process is set to be substantially parallel to the extending direction of each of the electrodes 3a, 3b (left-right direction in the figure). Here, it is not required to be precisely parallel and the direction of the rubbing process may be set to be off by about 0.1-5°, for example.

Here, the direction of the rubbing process described above is merely an example and when each of the alignment films is a vertical alignment film, the direction of the rubbing process may be set to be substantially parallel to the extending direction of each of the electrodes 3a, 3b (left-right direction in the figure). And when each of the alignment films 5,7 is a horizontal alignment film, the direction of the rubbing process may be set to be substantially perpendicular to the extending direction of each of the electrodes 3a, 3b (left-right direction in the figure).

Figure 4F:
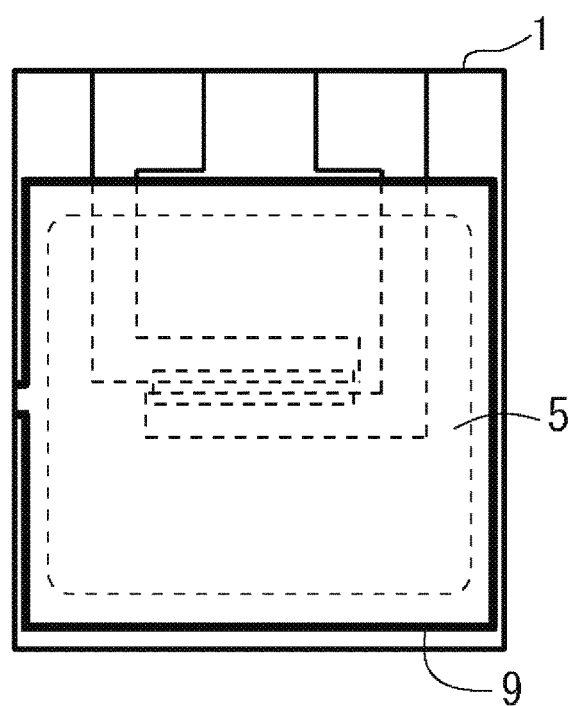

Next, referring to FIG. 4F, on one of the two substrates, on one surface side of the first substrate 1 for example, is formed a seal member 9 including appropriate amount (2-5 wt %, for example) of gap control material. The seal member 9 is formed by screen printing method or dispenser method. Further, in this embodiment, the diameter of the gap control material is set so that the thickness of the liquid crystal layer 8 becomes approximately 10 μm.

The thickness of the liquid crystal layer 8 is not limited to the numerical value described above. If increasing the bending angle of light passing through (light bending angle) is desired, then the thickness of the liquid crystal layer 8 is to be increased. And if operating speed (reaction speed) of the liquid crystal layer 8 with respect to the electric field is desired, then the thickness of the liquid crystal layer 8 is to be decreased. Specifically, the thickness of the liquid crystal layer 8 may be set to 2 nm-500 μm, for example.

Further, on the other substrate, namely on one surface side of the second substrate 2, the gap control material is sprayed. For example, plastic balls whose grain size is 10 μm are sprayed using dry spreaders. Or rib forming material may be provided to control the gap. The height/thickness of the gap control material (or the rib forming material) in this case is set to be nearly equal to the diameter of the gap control material included in the seal member 9. Furthermore, it is preferable that the gap control material (or the rib forming material) is not disposed to the gap between each of the electrodes 3a, 3b (the slit portion). Here, if the size of the liquid crystal element is larger than approximately 10 mm-square, then it is preferable to apply this process, but if the size of the liquid crystal element is equal to or smaller than the said value, this process may be omitted.

Next, each of one surface side of the first substrate 1 and the second substrate 2 are overlapped so that they oppose each other, and then heat-treated while applying a constant pressure with a pressing machine and the like, thereby hardening the seal member 9. For example, heat treatment is performed at 150 C.° and 3 hours of baking. Consequently, the first substrate 1 and the second substrate 2 are bonded.

Figure 5A:
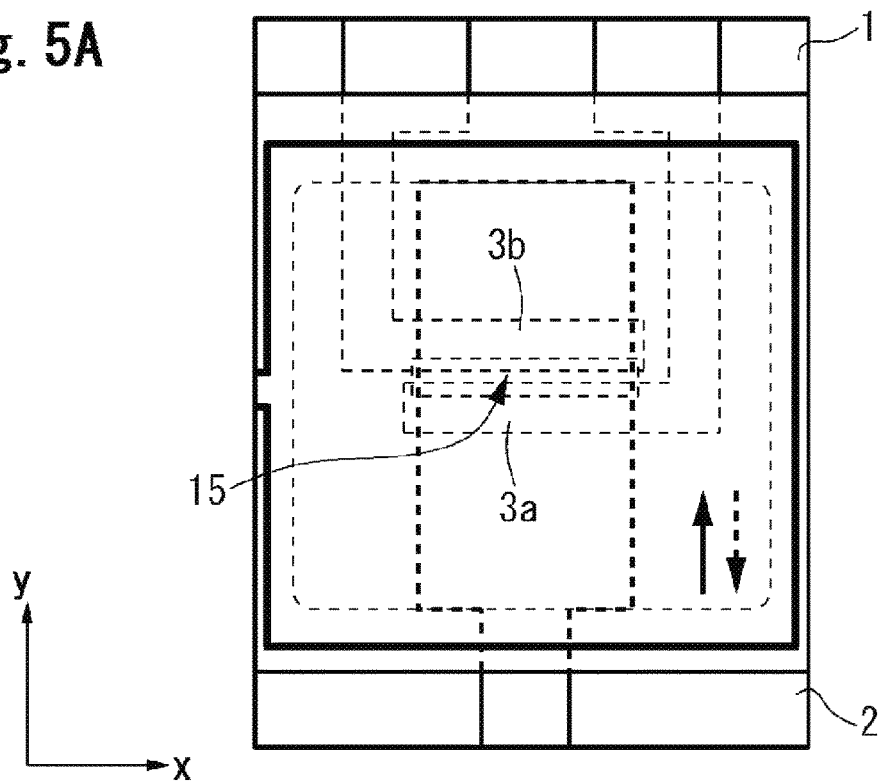
FIGS. 5A-5B are schematic plan views describing the manufacturing process of the liquid crystal element.

FIG. 5A is a schematic plan view of the cell (hereinafter referred to as cell 1) obtained by bonding the first substrate 1 and the second substrate 2 where each substrate forms a vertical alignment film as the alignment film 5,7, respectively. In this cell, as shown in the arrows in the lower right side of the figure, the alignment processing direction of the first substrate 1 (upward y-direction in the figure) and the alignment processing direction of the second substrate 2 (downward y-direction in the figure) becomes an anti-parallel alignment. And further, each of the alignment processing directions is substantially perpendicular to the extending direction of a slit portion 15 (x-direction in the figure) between each of the electrodes 3a, 3b. Here, the slit portion 15 is a slit shaped gap (groove) formed between a pair of the electrodes 3a, 3b (hereinafter the same).

Figure 5B:
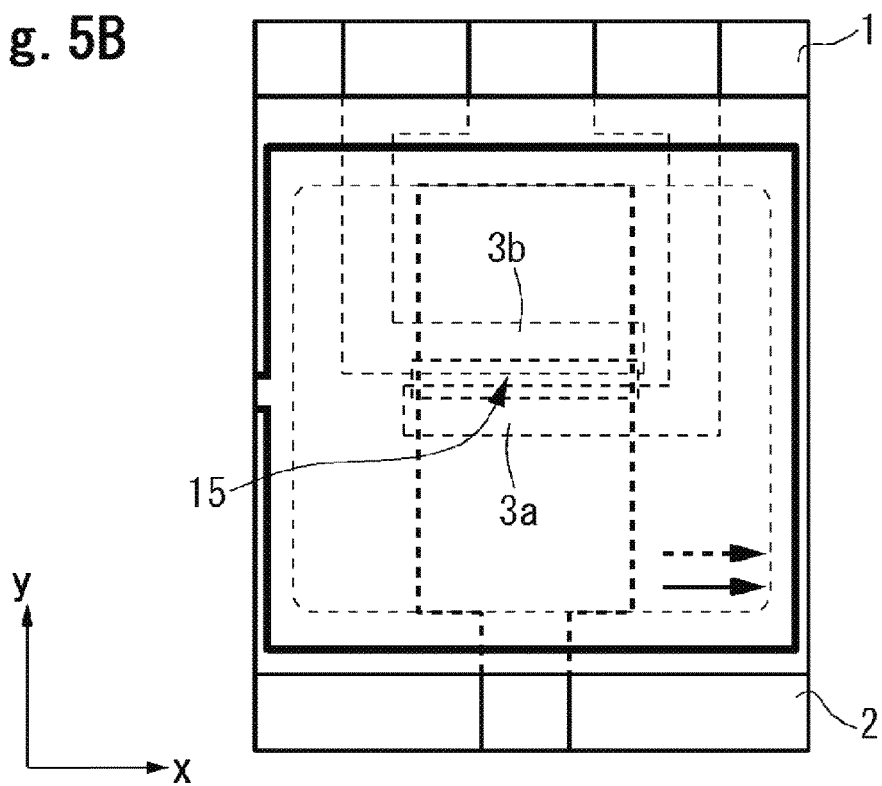

FIG. 5B is a schematic plan view of the cell (hereinafter referred to as cell 2) obtained by bonding the first substrate 1 and the second substrate 2 where each substrate forms a horizontal alignment film as the alignment film 5,7, respectively. In this cell, as shown in the arrows in the lower right side of the figure, the alignment processing direction of the first substrate 1 (toward the right along the x direction in the figure) and the alignment processing direction of the second substrate 2 (toward the right along the x direction in the figure) becomes a parallel alignment. And further, each of the alignment processing directions is substantially parallel to the extending direction of a slit portion 15 (x-direction in the figure) between each of the electrodes 3a, 3b. Here, the alignment processing direction of the first substrate 1 and the alignment processing direction of the second substrate 2 may be an anti-parallel alignment. Either of the alignment processing directions may be selected in the above-described alignment processing step.

Next, to each of the cells 1, 2, a liquid crystal layer 8 is formed by filling liquid crystal material between the first substrate 1 and the second substrate 2. For example, through the injection port provided by the seal member 9, liquid crystal material is filled between the first substrate 1 and the second substrate 2 by vacuum injection method. Cell 1 is filled with liquid crystal material whose dielectric anisotropy Δε is negative (for example, the refractive index anisotropy Δn being approximately 0.25). Cell 2 is filled with liquid crystal material whose dielectric anisotropy Δε is positive (for example, the refractive index anisotropy Δn being approximately 0.2). Here, liquid crystal material with no chiral material included is used. In order to increase the light bending angle, it is preferable to use liquid crystal material whose refractive index anisotropy Δn is greater.

After liquid crystal material is filled into each of the cells, the injection port is sealed with an end-seal. And by performing heat treatment above the phase transition temperature of the liquid crystal material (at 120 C.° and 1 hour of baking, for example), the alignment state of the liquid crystal elements of the liquid crystal layer 8 is stabilized. Liquid crystal element 100 is then completed.

FIG. 6 is a schematic diagram showing the configuration of a light control apparatus using the liquid crystal element. The light control apparatus comprises the liquid crystal element 100 corresponding to cell 1 as described above and a drive unit 101 to drive the liquid crystal element 100. The apparatus is capable of fully changing the direction of the advancing laser beam emitting from a light source 102, for example. In the example shown in the figure, the laser beam emitting from the light source 102 is a polarized light whose polarization direction is along the x-direction in the figure. In the liquid crystal element 100, with reference to the polarization direction of the laser beam, the alignment processing direction of each of the alignment films 5,7 (the alignment direction of the liquid crystal layer 8) is substantially parallel thereto, and the extending direction of slit portion 15 is substantially perpendicular thereto (refer to FIGS. 5A, 5B). The liquid crystal element 100 is arranged so that the laser beam enters the slit portion 15 substantially perpendicularly. The drive unit 101 is connected to each of the extraction electrodes 13a, 13b, 14 (refer to FIG. 2) and provides a driving voltage to the liquid crystal layer 8 via these electrodes.

For example, from the drive unit 101 to the liquid crystal element 100, alternating voltage is applied to the electrode 3a and a reference potential is applied to the electrode 3b and the common electrode 6 (for example, connecting to a grounding terminal) via each of the extraction electrodes 13a, etc. The voltage magnitude and frequency may be set as desired, and for example, is set to 15V and 100 Hz. Thus, the laser beam entering the liquid crystal element 100 changes its advancing direction to one direction along the x-direction (for example, to the right) in the figure with reference to the advancing direction when voltage is not applied. Further, when alternating voltage is applied to the electrode 3b and a reference potential is applied to the electrode 3a and the common electrode 6 from the drive unit 101, the laser beam entering the liquid crystal element 100 changes its advancing direction to the opposite direction (for example, to the left).

Here, the voltage capable of changing the direction of the advancing laser beam to its maximum light bending angle θ depends on the distance between the electrode 3a and the electrode 3b, the spot diameter of the laser beam, the liquid crystal layer thickness, and so on. Similarly, the frequency depends on the distance between the electrode 3a and the electrode 3b, the spot diameter of the laser beam, the liquid crystal layer thickness, and so on, but there is a tendency for the maximum light bending angle θ to increase when the frequency is higher. FIG. 7 shows the measurement results of the light bending angle θ and the response speed, based on several conditions. In the figure, the measurement results of light bending angle θ and the response speed are shown when the driving condition and the liquid crystal layer thickness (cell thickness) were changed in the liquid crystal element 100 corresponding to cell 1. Now, the liquid crystal element 100 used for this measurement was manufactured by the process described above under the exemplified conditions.

Figure 8:
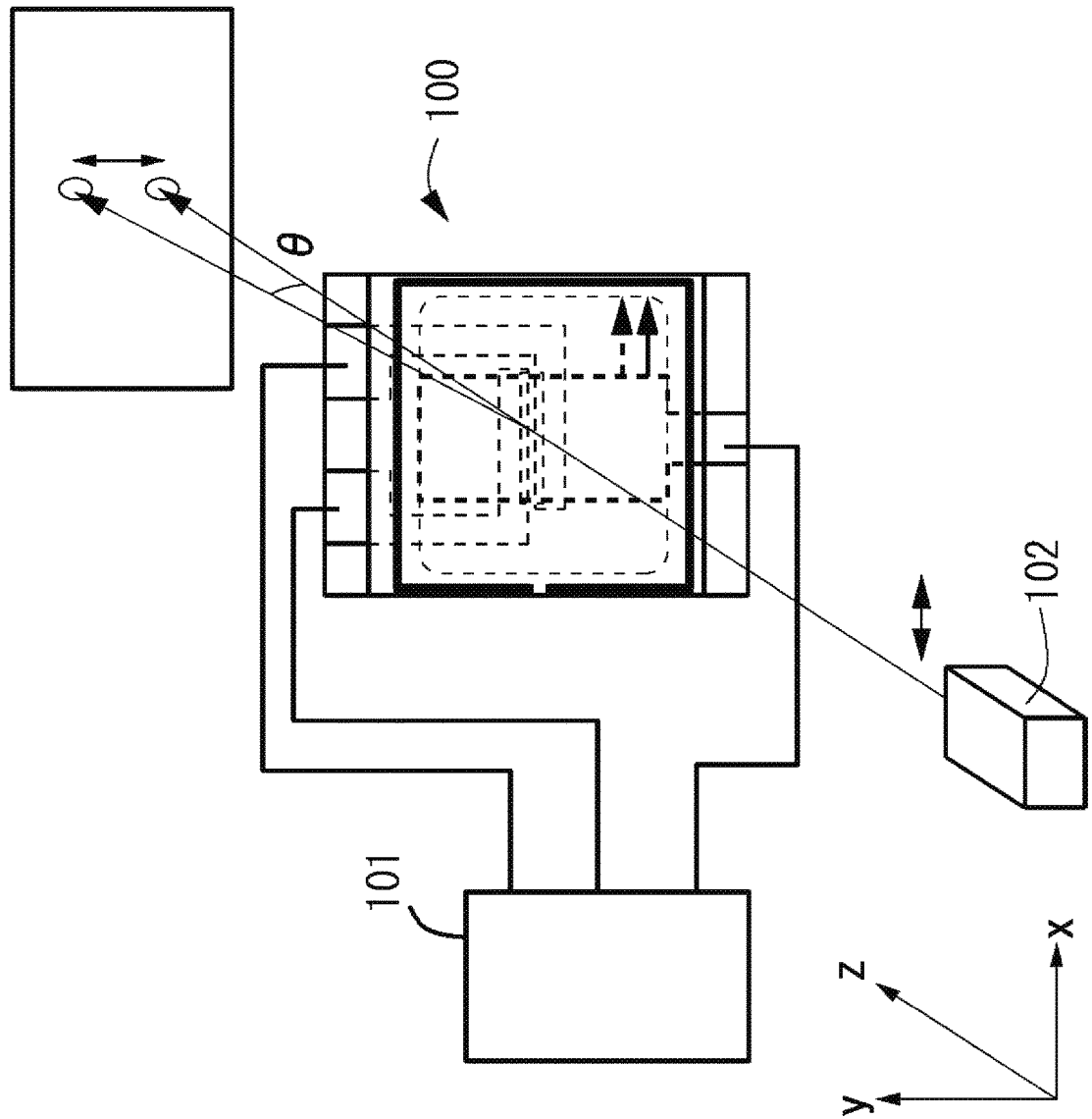
FIG. 8 is a schematic diagram showing another configuration of a light control apparatus using a liquid crystal element.

FIG. 8 is a schematic diagram showing another configuration of a light control apparatus using a liquid crystal element. The light control apparatus comprises the liquid crystal element 100 corresponding to cell 2 as described above and a drive unit 101 to drive the liquid crystal element 100. The apparatus is capable of fully changing the direction of the advancing laser beam emitting from a light source 102, for example. In the example shown in the figure, the laser beam emitting from the light source 102 is a polarized light whose polarization direction is along the x-direction in the figure. In the liquid crystal element 100, with reference to the polarization direction of the laser beam, the alignment processing direction of each of the alignment films 5,7 (the alignment direction of the liquid crystal layer 8) is substantially parallel thereto, and the extending direction of the slit portion 15 is also substantially parallel thereto (refer to FIGS. 5A, 5B). The liquid crystal element 100 is arranged so that the laser beam enters the slit portion 15 substantially perpendicularly. The drive unit 101 is connected to each of the extraction electrodes 13a, 13b, 14 (refer to FIG. 2) and provides a driving voltage to the liquid crystal layer 8 via these electrodes.

For example, from the drive unit 101 to the liquid crystal element 100, alternating voltage is applied to the electrode 3a and a reference potential is applied to the electrode 3b and the common electrode 6 (for example, connecting to a grounding terminal) via each of the extraction electrodes 13a, etc. The voltage magnitude and frequency may be set as desired, and for example, is set to 30V and 100 Hz. Thus, the laser beam entering the liquid crystal element 100 changes its advancing direction to one direction along the y-direction (for example, to the upward direction) in the figure with reference to the advancing direction when voltage is not applied. Further, when alternating voltage is applied to the electrode 3b and a reference potential is applied to the electrode 3a and the common electrode 6 from the drive unit 101, the laser beam entering the liquid crystal element 100 changes its advancing direction to the opposite direction (for example, to the downward direction).

Here, the voltage capable of changing the direction of the advancing laser beam to its maximum light bending angle θ depends on the distance between the electrode 3a and the electrode 3b, the spot diameter of the laser beam, the liquid crystal layer thickness, and so on. Similarly, the frequency depends on the distance between the electrode 3a and the electrode 3b, the spot diameter of the laser beam, the liquid crystal layer thickness, and so on, but there is a tendency for the maximum light bending angle θ to increase when the frequency is higher. FIG. 9 shows the measurement results of the light bending angle θ and the response speed, based on several conditions. In the figure, the measurement results of light bending angle θ and the response speed are shown when the driving condition and the liquid crystal layer thickness (cell thickness) were changed in the liquid crystal element 100 corresponding to cell 2. Now, the liquid crystal element 100 used for this measurement was manufactured by the process described above under the exemplified conditions. The above description explains the parallel alignment as the alignment state. Further, an antiparallel-aligned liquid crystal element 100 was manufactured and then compared to the parallel-aligned liquid crystal element 100. As a result, there was a tendency for the parallel-aligned liquid crystal element to increase its response speed, yet reduce its light bending angle. The cause for the increase in response speed of the parallel-aligned element is considered that when voltage is applied to the liquid crystal layer, alignment mode transitions from splay-alignment to bend-alignment and the element operates in the bend-alignment mode.

To summarize the driving method of the liquid crystal element, the liquid crystal element of the embodiment is provided a first substrate 1 with two electrodes 3a, 3b and a second substrate 2 with a common electrode 6, and a liquid crystal layer 8 is AC driven by these electrodes. When AC driven, if light bending angle is not to be changed (θ=0), then each of the electrodes 3a, 3b are set to the same potential and the potential of the common electrode 6 may be same as that of each of the electrodes 3a, 3b or may be different. If the direction of the light is to be changed, then the electrode 3a and the common electrode 6 are provided the same potential and the electrode 3b is provided a different potential. Further, if the direction of the light is to be reversed, then the electrode 3b and the common electrode 6 are provided the same potential and the electrode 3a is provided a different potential. By the use of this driving method, the direction of the advancing light can be controlled symmetrically along a predetermined direction (for example, the vertical direction or the horizontal direction).

Embodiment 2

In embodiment 1 described above, changing the direction of the advancing light one-dimensionally using one liquid crystal element was described. Here, as embodiment 2, by combining two liquid crystal elements, the direction of the advancing light can be changed two-dimensionally. The following describes the components in order to realize embodiment 2. It should be noted that the detailed descriptions of components common to embodiment 1 are omitted.

Figure 10A:
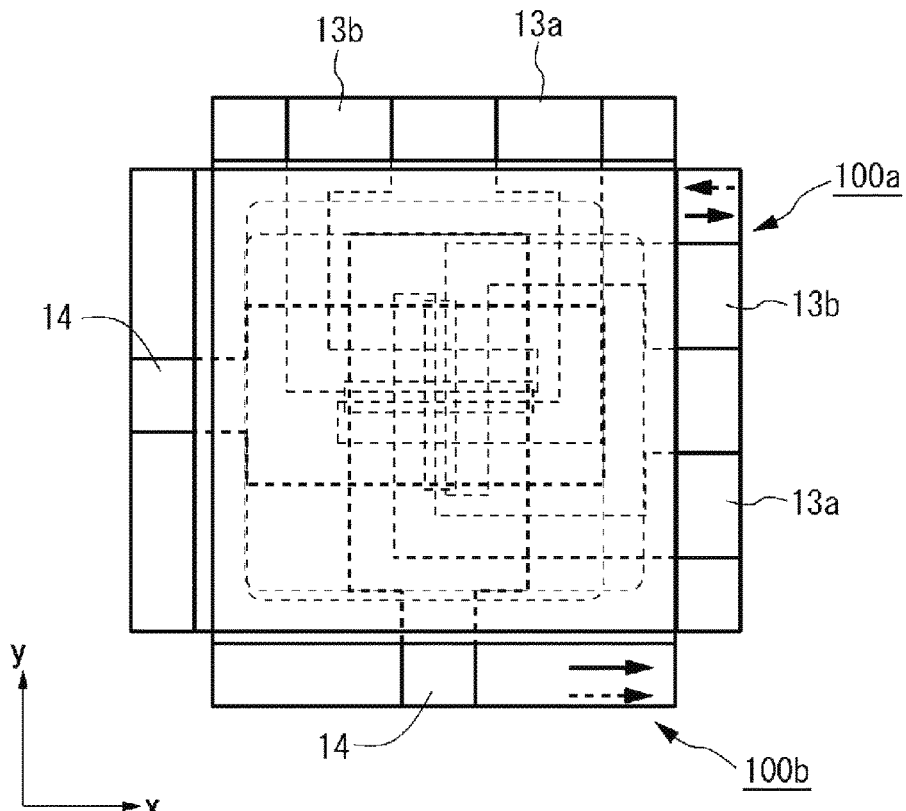
FIG. 10A is a schematic plan view showing the structure of the liquid crystal elements according to embodiment 2.

FIG. 10A is a schematic plan view showing the structure of the liquid crystal elements according to embodiment 2. Here, for the purpose of viewing clarity, seal member 9 is omitted. As shown in FIG. 10A, the liquid crystal elements in embodiment 2 includes a liquid crystal element 100a corresponding to cell 1 as described in embodiment 1 and a liquid crystal element 100b corresponding to cell 2 disposed to overlap each other.

In detail, the liquid crystal element 100a is disposed on the front side of the figure and a slit portion 15 extending in one direction (refer to FIG. 5A) is disposed so that its extending direction is parallel to the x-direction. Here, the alignment direction of the molecules in the liquid crystal layer 8 is parallel to the x-direction and is an anti-parallel alignment. Further, the liquid crystal element 100b is disposed on the back side of the figure and a slit portion 15 extending in one direction (refer to FIG. 5B) is disposed so that its extending direction is parallel to the y-direction. Here, the alignment direction of the molecules in the liquid crystal layer 8 is parallel to the x-direction and is a parallel alignment.

Figure 10B:
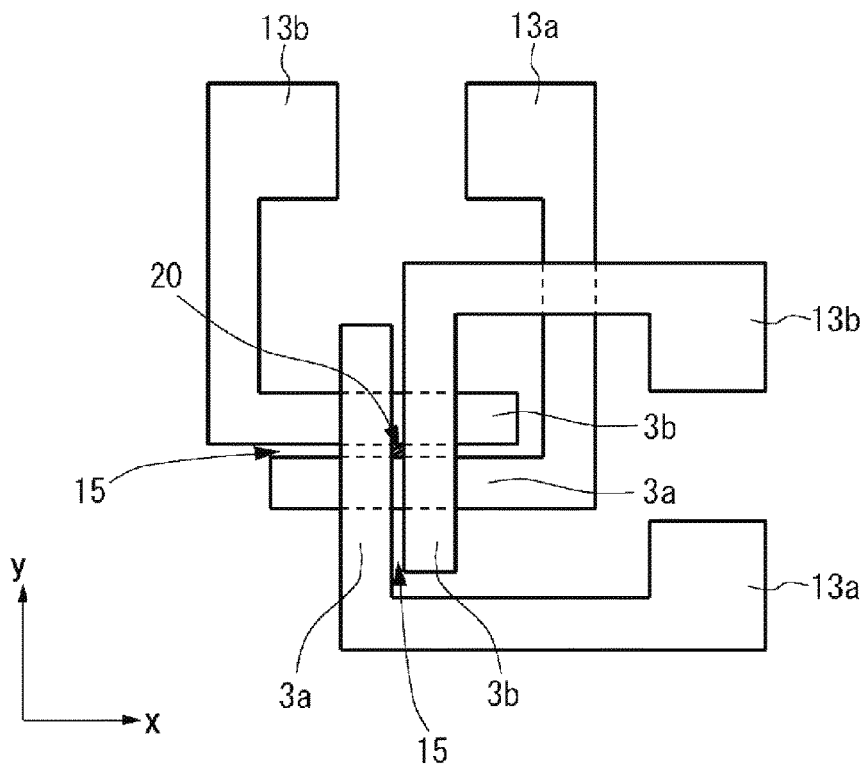
FIG. 10B is a figure describing the electrode arrangement of each of the liquid crystal elements.

FIG. 10B is a figure describing the electrode arrangements of each of the liquid crystal elements. As shown in the figure, the liquid crystal element 100a on the front side is disposed so that the slit portion 15 which is a groove (gap) between each of the electrodes 3a, 3b extends in the direction substantially parallel to the y-direction (the vertical direction). And the liquid crystal element 100b on the back side is disposed so that the slit portion 15 which is a groove (gap) between each of the electrodes 3a, 3b extends in the direction substantially parallel to the x-direction (the horizontal direction). Further, the two elements are disposed so that the slit portion 15 of the liquid crystal element 100a and the slit portion 15 of the liquid crystal element 100b cross each other (in this example, cross perpendicularly to each other). The rectangular area 20 where each of the slit portions 15, 15 overlap is used as an incident region where the controlled light such as a laser beam and the like enters.

The liquid crystal element 100a disposed on the front side is capable of changing the advancing direction of the laser beam emitting from the light source 102 to the x-direction in the figure by applying a driving voltage from the drive unit 101 thereto via each of the electrodes 3a, 3b and the common electrode 6 (refer to FIG. 6). Further, the liquid crystal element 100b disposed on the back side is capable of changing the direction of the advancing laser beam emitting from the light source 102 to the y-direction in the figure by applying a driving voltage from the drive unit 101 thereto via each of the electrodes 3a, 3b and the common electrode 6 (refer to FIG. 8). Thus, by disposing the two liquid crystal elements 100a, 100b to overlap each other as shown in FIG. 10A, it is possible to change the direction of the advancing light to the x-direction and the y-direction, or the vertical direction and the horizontal direction.

In this embodiment, the direction of the advancing light controlled by the liquid crystal element 100a on the front side is parallel to the x-direction, and since the slit portion of the liquid crystal element 100b on the back side is located where the emitting light is advancing, and is disposed to extend parallel to the x-direction, it is possible to easily guide the light into the slit portion 15 of the liquid crystal element 100b disposed on the back side even when the emitting light sways in the x-direction. Thus, since the liquid crystal element 100a disposed on the front side controls the direction of light along the x-direction and the liquid crystal element 100b disposed on the back side controls the direction of light along the y-direction, consequently it is possible to control the direction of the light emitted from the liquid crystal element 100b two-dimensionally.

Figure 11:
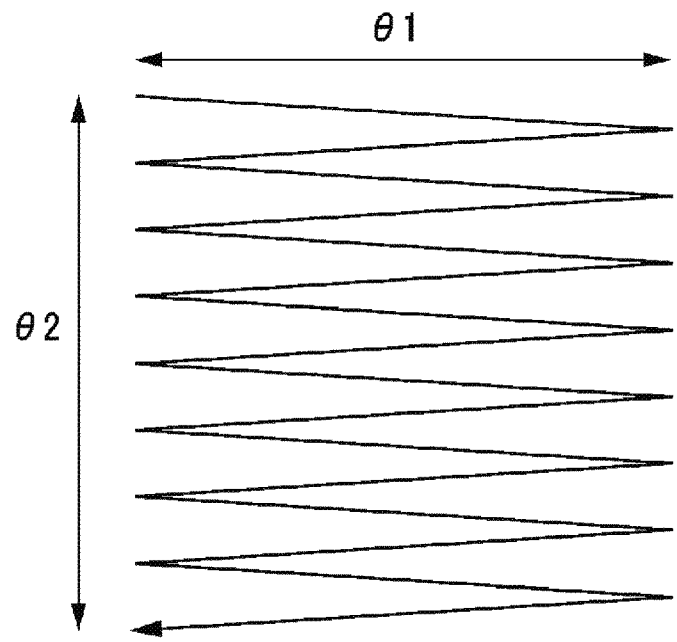
FIG. 11 shows how the incident light is scanned two-dimensionally.

Further, by creating a difference between the response speed of the liquid crystal element 100a on the front side and the liquid crystal element 100b on the back side, as shown in FIG. 11, it is possible to scan the incident light two-dimensionally. In this case, the incident light is scanned within the range defined by the light bending angle θ1 from the liquid crystal element 100a and the light bending angle θ2 from the liquid crystal element 100b. For example, by using the liquid crystal element 100a on the front side whose cell thickness is 10 µm (refer to FIG. 7, second row) and the liquid crystal element 100b on the back side whose cell thickness is 100 µm (refer to FIG. 9, third row) and by applying voltage alternately and repeatedly to the liquid crystal element 100a as 15V, 0V, 15V, . . . at 300 ms cycle, and further applying voltage alternately and repeatedly to the liquid crystal element 100b as 50V, 0V, 50V, . . . at 5 s cycle, it is possible to scan the light within the range defined by the light bending angle θ1=14.4° and the light bending angle θ2=14.6°.

Also, when laser beam is not applied continuously but intermittently, it is possible to scan the light only in an arbitrary area within the range defined by each of the light bending angles θ1, θ2. Further, it is possible to apply a reverse bias by alternately switching/selecting the electrode to be the high potential side, between each of the electrodes 3a, 3b, thereby increasing the response speed.

Embodiment 3

As in embodiment 2 described above, by combining two liquid crystal elements, and further combining a half-wave plate (λ/2 plate), the direction of advancing light can be changed two-dimensionally. The following describes the components in order to realize embodiment 3. It should be noted that the detailed descriptions of components common to embodiment 1 and embodiment 2 are omitted.

Figure 12:
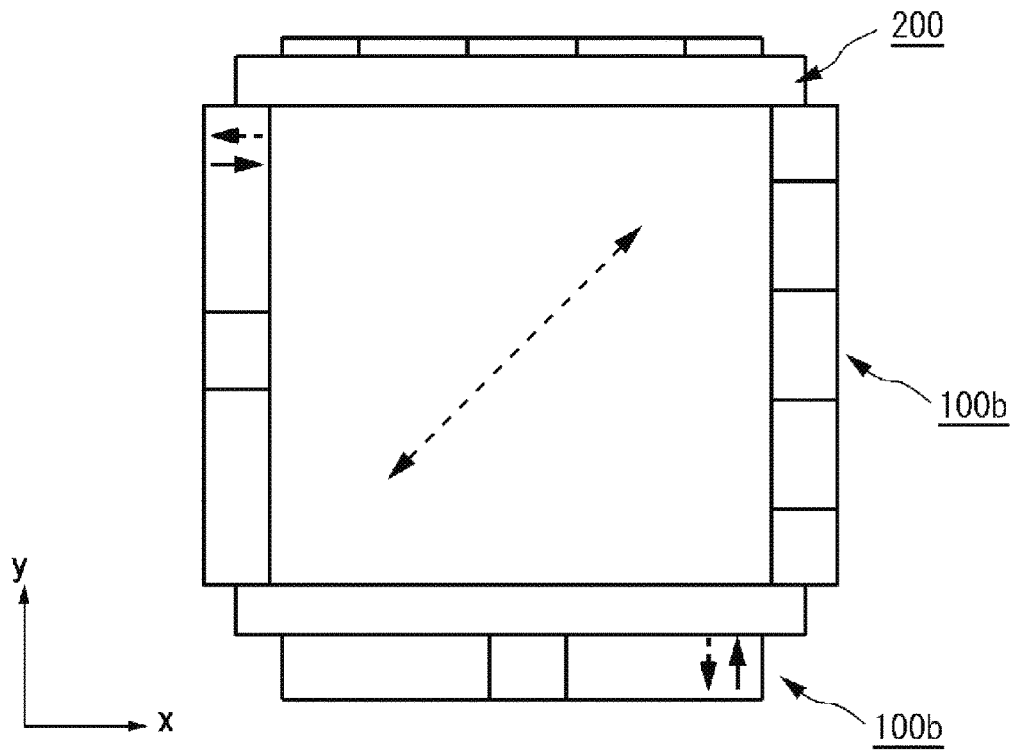
FIG. 12 is a schematic plan view showing the structure of the liquid crystal elements according to embodiment 3.

FIG. 12 is a schematic plan view showing the structure of the liquid crystal elements according to embodiment 3. Here, for the purpose of viewing clarity, the inner structure of each of the liquid crystal elements is omitted. As shown in FIG. 12, the liquid crystal elements according to embodiment 3 includes two liquid crystal elements 100b corresponding to cell 2 as described in embodiment 1 disposed to overlap each other and a half-wave plate 200 disposed therebetween. Here, in this embodiment, elements including two liquid crystal elements 100a corresponding to cell 1 as described in embodiment 1 disposed to overlap each other and a half-wave plate 200 disposed therebetween may also be used.

As shown in FIG. 12, each of the liquid crystal elements 100b, 100b is disposed so that the extending directions of their slit portions 15, 15 are substantially perpendicular to each other. Specifically, the liquid crystal element 100b on the front side is disposed so that the slit portion 15 extends in the direction substantially parallel to the y-direction. Further, the liquid crystal element 100b on the front side is disposed so that the alignment direction of the molecules in liquid crystal layer 8 (the horizontal direction) and the extending direction of the slit portion 15 (the vertical direction) are substantially perpendicular to each other. The liquid crystal element 100b on the back side is disposed so that its slit portion 15 extends in the direction substantially parallel to the x-direction. Also, the liquid crystal element 100b on the back side is disposed so that the alignment direction of the molecules in liquid crystal layer 8 (the vertical direction) and the extending direction of the slit portion 15 (the horizontal direction) are substantially perpendicular to each other. Further, the half-wave plate 200 disposed between each of the liquid crystal elements 100b, 100b is arranged so that the direction of its optic axis (shown in a arrowed dotted line in the figure) forms an angle of 45° with respect to the extending direction of each of the slit portions 15, 15 (x-direction, y-direction).

If the alignment direction of the molecules in liquid crystal layer 8 and the polarization direction of the laser beam emitted from the light source 102 are parallel to each other (refer to FIG. 8), then the liquid crystal element 100b on the front side changes the direction of the laser beam entered therein along the x-direction. The laser beam passes through the half-wave plate 200 and thereby rotates the polarization direction by 90°. Consequently, the polarization direction becomes parallel to the y-direction. The laser beam enters the liquid crystal element 100b on the back side. Since the alignment direction of the molecules in liquid crystal layer 8 and the polarization direction of the laser beam are parallel to each other, the liquid crystal element 100b on the back side changes the direction of the laser beam entered therein along the y-direction. Thus, since the liquid crystal element 100b disposed on the front side controls the direction of light along the x-direction and the liquid crystal element 100b disposed on the back side controls the direction of light along the y-direction, consequently it is possible to control the direction of the light emitting from the liquid crystal element 100b two-dimensionally. In this embodiment, since the slit portion 15 of the liquid crystal element 100b on the back side where the laser beam emitted from the liquid crystal element 100b on the front side advances is disposed so that the slit portion extends in the direction substantially parallel to the x-direction, it is possible to guide the light into the slit portion 15 of the liquid crystal element 100b disposed on the back side even when the emitting light sways in the x-direction.

Embodiment 4

In embodiments 1-3 described above, between the two electrodes with a high-resistance film disposed therebetween is applied a continuous voltage gradient thereby continuously changing the alignment state of the molecules in the liquid crystal layer 8. In this embodiment, one of the two electrodes is disposed on the first electrode 1 side and the other is disposed on the second electrode 2 side generating an oblique electric field, thereby capable of achieving a similar operation. The following describes the components of the embodiment.

Figure 13A:
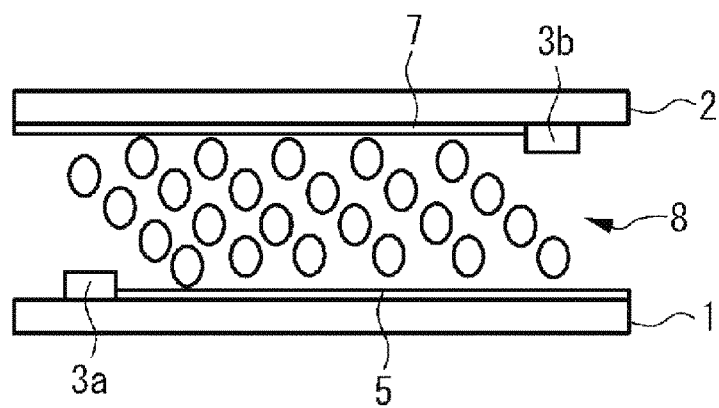
FIGS. 13A-13C are schematic cross sectional views to describe the basic structure and the operation principle of the liquid crystal element according to embodiment 4.
Figure 13B:
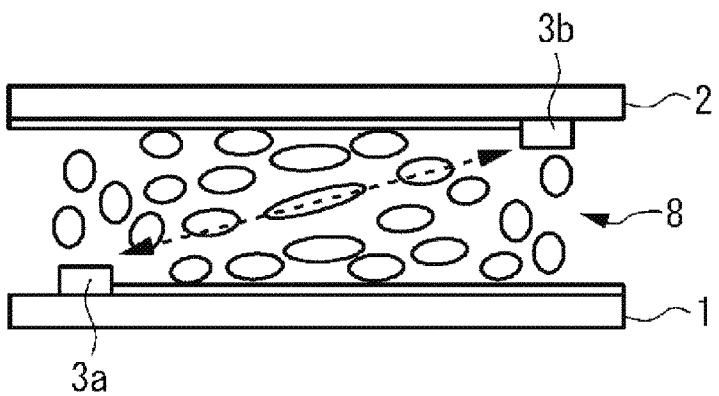
Figure 13C:
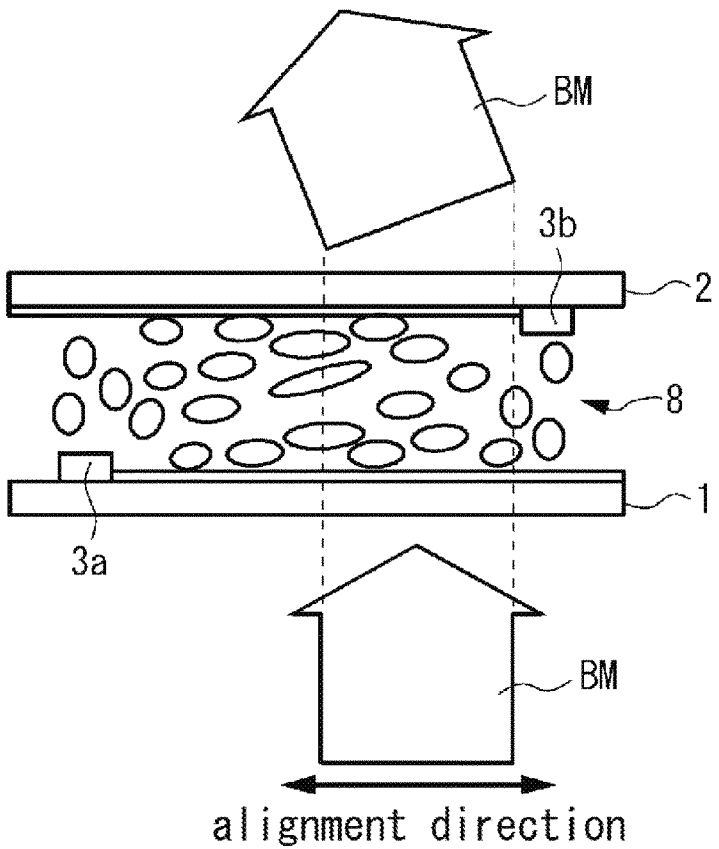

FIGS. 13A-13C are schematic cross sectional views to describe the basic structure and the operation principle of the liquid crystal element according to embodiment 4. In the liquid crystal element shown in FIG. 13A, a liquid crystal layer 8 is provided between two substrates 1, 2 (transparent substrates) disposed opposite each other. And on one surface side of the substrate 1 is disposed an electrode 3a and an alignment film 5, and on one surface of the substrate 2 is disposed an electrode 3b and an alignment film 7.

In the example shown in the figure, each of the alignment films 5, 7 is performed an alignment process such as a rubbing treatment and is a vertical alignment film whose alignment regulation force extends in one direction. Further, the liquid crystal layer 8 is formed by using liquid crystal material in which the dielectric anisotropy is negative. And the liquid crystal molecules in the liquid crystal layer 8 are affected by alignment regulation force of the alignment films 5, 7 and are aligned in one direction, horizontal (left-right) direction in the figure for example. The liquid crystal molecules are substantially vertically aligned when voltage is not applied (initial alignment). Note that, in principle, on each of the alignment films 5, 7, alignment process such as a rubbing treatment may be performed to achieve horizontal alignment films with alignment regulation force in one direction. In this case, the liquid crystal layer 8 is formed by using liquid crystal material in which the dielectric anisotropy is positive. And the liquid crystal molecules in the liquid crystal layer 8 are affected by alignment regulation force of the alignment films 5, 7 and are aligned in one direction, horizontal (left-right) direction in the figure for example. The liquid crystal molecules are substantially horizontally aligned when voltage is not applied (initial alignment).

As shown in FIG. 13B, for example, voltage is applied to generate a potential difference between the electrode 3a and the electrode 3b. As an example, voltage of 15V is applied to the electrode 3a, and 0V is applied to the electrode 3b. An alternating voltage of 100 Hz frequency is applied, for example. This voltage application generates an oblique electric field between the electrode 3a and the electrode 3b and the oblique electric field continuously changes the alignment state of the molecules in the liquid crystal layer 8.

Polarized light such as a laser beam, etc. is made incident to the liquid crystal element in the state described above. For example, as shown in FIG. 13C, a beam BM whose polarization direction is parallel to the alignment processing direction of each of the alignment films 5, 7 is made incident to the other surface side of the substrate 1. Then, as shown in the figure, since the alignment state of the molecules in the liquid crystal layer 8 is continuously changing and thus the state of retardation is different depending on the location inside the liquid crystal layer 8, the passing speed of the beam BM differs depending on the location it passes through. Therefore, by applying Huygens' principle, it is considered that the direction of the advancing beam BM which passes through the liquid crystal layer 8 changes.

As an example, a liquid crystal element was manufactured under the same conditions as that of the cell 2 of embodiment 1 described above, namely cell thickness of 100 μm and the alignment condition being anti-parallel alignment, and the operation was checked. Under the driving condition of 50V, 100 Hz, when the distance between each of the electrodes 3*a*, 3*b* (the distance in a planer view) was 200 μm, the light bending angle of 1.64° and the response speed of 5 s were achieved, and when the distance between each of the electrodes 3*a*, 3*b* was 300 μm, the light bending angle of 2.05° and the response speed of 5 s were achieved. As the distance between each of the electrodes 3*a*, 3*b* was increased, there was a tendency for the light bending angle to became greater.

Based on each of the foregoing embodiments, it is possible to improve the accuracy of fully controlling the direction of advancing light. Note that this invention is not limited to the subject matter of the foregoing embodiments, and can be implemented by being variously modified within the scope of the gist of the present invention.

What is claimed is:

1. A liquid crystal element comprising:
   a first substrate and a second substrate disposed opposite each other,
   a liquid crystal layer provided between a surface side of the first substrate and a surface side of the second substrate,
   a pair of separate electrodes provided on the surface side of the first substrate with a gap therebetween when viewed in a plan view,
   a high-resistance film provided on the surface side of the first substrate and disposed between the pair of electrodes when viewed in the plan view and connected thereto,
   a first alignment film provided on the surface side of the first substrate, covering the pair of electrodes and the high-resistance film, and
   a second alignment film provided on the surface side of the second substrate,
   wherein the pair of electrodes are made of an oxide semiconductor film,
   wherein a sheet resistance of the high-resistance film is 10 to $10^{10}$ times greater than a sheet resistance of the pair of electrodes,
   wherein the high-resistance film generates a voltage gradient from one of the pair of electrodes to the other of the pair of electrodes, and
   wherein the pair of electrodes are disposed at both ends of the high-resistance film and fully cover side surfaces of the high-resistance film.

2. The liquid crystal element according to claim 1, further comprising:
   a common electrode provided on the surface side of the second substrate,
   wherein the common electrode is disposed to overlap the pair of electrodes and to be covered by the second alignment film when viewed in the plan view.

3. The liquid crystal element according to claim 1,
   wherein the first alignment film and the second alignment film are vertical alignment films whose alignment regulation force extends in one direction, and
   wherein the one direction is substantially parallel or perpendicular to an extending direction of the gap between the pair of electrodes.

4. The liquid crystal element according to claim 1,
   wherein the first alignment film and the second alignment film are horizontal alignment films whose alignment regulation force extends in one direction, and
   wherein the one direction is substantially parallel or perpendicular to an extending direction of the gap between the pair of electrodes.

5. A light control apparatus comprising:
   a first liquid crystal element and a second liquid crystal element disposed to overlap each other,
   a drive unit for driving the first liquid crystal element and the second liquid crystal element,
   wherein the liquid crystal element according to claim 1 is respectively used for the first liquid crystal element and the second liquid crystal element.

6. A driving method for the liquid crystal element according to claim 2, wherein one of the pair of electrodes and the common electrode is provided a first potential, and the other of the pair of electrodes is provided a second potential which is different from the first potential.

7. A liquid crystal element comprising:
   a first substrate and a second substrate disposed opposite each other,
   a liquid crystal layer provided between a surface side of the first substrate and a surface side of the second substrate,
   a pair of separate electrodes provided on the surface side of the first substrate with a gap therebetween when viewed in a plan view,
   a high-resistance film provided on the surface side of the first substrate and disposed between the pair of electrodes when viewed in the plan view and connected thereto,
   a first alignment film provided on the surface side of the first substrate, covering the pair of electrodes and the high-resistance film, and
   a second alignment film provided on the surface side of the second substrate,
   wherein the pair of electrodes are made of an oxide semiconductor film,
   wherein a sheet resistance of the high-resistance film is 100 to $10^{10}$ times greater than a sheet resistance of the pair of electrodes,
   wherein the high-resistance film generates a voltage gradient from one of the pair of electrodes to the other of the pair of electrodes, and
   wherein the pair of electrodes are disposed at both ends of the high-resistance film and fully cover side surfaces of the high-resistance film.

8. The liquid crystal element according to claim 7, further comprising:
   a common electrode provided on the surface side of the second substrate,
   wherein the common electrode is disposed to overlap the pair of electrodes and to be covered by the second alignment film when viewed in the plan view.

9. The liquid crystal element according to claim 7,
   wherein the first alignment film and the second alignment film are vertical alignment films whose alignment regulation force extends in one direction, and
   wherein the one direction is substantially parallel or perpendicular to an extending direction of the gap between the pair of electrodes.

10. The liquid crystal element according to claim 7,
wherein the first alignment film and the second alignment film are horizontal alignment films whose alignment regulation force extends in one direction, and
wherein the one direction is substantially parallel or perpendicular to an extending direction of the gap between the pair of electrodes.

11. A liquid crystal element comprising:
a first substrate and a second substrate disposed opposite each other,
a liquid crystal layer provided between a surface side of the first substrate and a surface side of the second substrate,
a pair of separate electrodes provided on the surface side of the first substrate with a gap therebetween when viewed in a plan view,
a high-resistance film provided on the surface side of the first substrate and disposed between the pair of electrodes when viewed in the plan view and connected thereto,
a first alignment film provided on the surface side of the first substrate, covering the pair of electrodes and the high-resistance film, and
a second alignment film provided on the surface side of the second substrate,
wherein a sheet resistance of the high-resistance film is approximately 1 k$\Omega$/sq-10 G$\Omega$/sq,
wherein the high-resistance film generates a voltage gradient from one of the pair of electrodes to the other of the pair of electrodes, and
wherein the pair of electrodes are disposed at both ends of the high-resistance film and fully cover side surfaces of the high-resistance film.

12. The liquid crystal element according to claim 11, further comprising:
a common electrode provided on the surface side of the second substrate,
wherein the common electrode is disposed to overlap the pair of electrodes and to be covered by the second alignment film when viewed in the plan view.

13. The liquid crystal element according to claim 11,
wherein the first alignment film and the second alignment film are vertical alignment films whose alignment regulation force extends in one direction, and
wherein the one direction is substantially parallel or perpendicular to an extending direction of the gap between the pair of electrodes.

14. The liquid crystal element according to claim 11,
wherein the first alignment film and the second alignment film are horizontal alignment films whose alignment regulation force extends in one direction, and
wherein the one direction is substantially parallel or perpendicular to an extending direction of the gap between the pair of electrodes.

* * * * *